United States Patent
Xu (10) Patent No.: US 11,609,279 B1
(45) Date of Patent: Mar. 21, 2023

(54) VEHICLE SYSTEMS AND RELATED POWER MODULE HEALTH MONITORING METHODS

(71) Applicant: GM GLOBAL TECHNOLOGY OPERATIONS LLC, Detroit, MI (US)

(72) Inventor: Jinming Xu, Troy, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 0 days.

(21) Appl. No.: 17/654,188

(22) Filed: Mar. 9, 2022

(51) Int. Cl.
  *G01R 31/40* (2020.01)
  *H02M 1/00* (2006.01)
  *B60R 16/02* (2006.01)
  *H05K 7/20* (2006.01)

(52) U.S. Cl.
  CPC .............. *G01R 31/40* (2013.01); *B60R 16/02* (2013.01); *H02M 1/0003* (2021.05); *H05K 7/20872* (2013.01); *H05K 7/20927* (2013.01)

(58) Field of Classification Search
  None
  See application file for complete search history.

(56) References Cited

U.S. PATENT DOCUMENTS

| 8,169,779 | B2 | 5/2012 | Le et al. |
| 8,248,809 | B2 | 8/2012 | Miller et al. |
| 11,132,009 | B2 * | 9/2021 | Nazir ................. H02M 3/00 |

OTHER PUBLICATIONS

Aliyu, A.M., 2017. On-board health monitoring of power modules in inverters driving induction motors (Doctoral dissertation, University of Nottingham).

* cited by examiner

*Primary Examiner* — Jeffery S Zweizig
(74) *Attorney, Agent, or Firm* — Lorenz & Kopf LLP (57) ABSTRACT

Vehicles and related systems and methods are provided for monitoring health of a power conversion module. A method involves operating the power conversion module to conduct a heating current until reaching a steady-state temperature, obtaining measurement data for an electrical characteristic associated with the power conversion module after reaching the steady-state temperature, determining a current thermal characterization curve for the power conversion module based on the measurement data and comparing the current thermal characterization curve to one or more reference thermal characterization curves for the power conversion module to identify a deviation associated with the current thermal characterization curve. A component within a thermal path of the power conversion module is identified based on a location of a divergence point with respect to the current thermal characterization curve for automatically initiating a remedial action based on the component of the power conversion module associated with the deviation.

20 Claims, 5 Drawing Sheets

VEHICLE SYSTEMS AND RELATED POWER MODULE HEALTH MONITORING METHODS

INTRODUCTION

The technical field generally relates to vehicle systems and more particularly relates to onboard monitoring and detection of potential degradation of a power conversion module during operation of a vehicle.

In recent years, advances in technology have led to substantial changes in the design of automotive vehicles. In particular, electric motors (or electric machines) are finding an increasing number of applications in the automotive industry due to the electrification of the automotive drive system. Electric and/or hybrid vehicles utilize electric motors as either primary or supplemental torque sources in the automotive drive system. In electric and/or hybrid vehicles, the electric motor is typically powered by a rechargeable energy source, such as a battery, using one or more power conversion modules to produce the desired alternating current electrical signals across the stator windings of the electric motor.

Many electrical components generate heat as a byproduct when they dissipate electrical energy. Overheating often affects the performance and reliability of electronic components, and thus, electrical devices are routinely cooled to prevent overheating. In many power electronics applications, heat sinks are used where efficient heat dissipation is desired. However, increasing the weight and volume of the power electronics module by incorporating a heat sink is undesirable from a packaging perspective in automotive applications, where packaging space is limited and increasing the weight of the vehicle is undesirable. Accordingly, more complex alternative cooling methods may be employed to cool the power electronics module. That said, it remains desirable to monitor the power electronic module to facilitate preventative maintenance and avoid unexpected or unplanned inoperability due to degraded performance caused by heat or other mechanical stresses. Other desirable features and characteristics will become apparent from the subsequent detailed description and the appended claims, taken in conjunction with the accompanying drawings and the foregoing technical field and background.

SUMMARY

An aspect of a vehicle system is provided that includes a power conversion module comprising electrical components configured to provide a power converter contained within a housing, wherein the power conversion module comprises at least one thermal path between the electrical components and the housing, one or more sensors to obtain measurement data for an electrical characteristic associated with the power converter, a data storage element comprising computer readable instructions, and a processing device for executing the computer readable instructions. The computer readable instructions control the processing device to perform operations including operating the power converter to conduct a heating current until reaching a steady-state temperature, obtaining the measurement data after reaching the steady-state temperature, determining a current thermal characterization curve for the power conversion module based on the measurement data, comparing the current thermal characterization curve to one or more reference thermal characterization curves for the power conversion module to identify a deviation associated with the current thermal characterization curve, and in response to identifying the deviation, identifying a component associated with the deviation within the at least one thermal path of the power conversion module based on a location of a divergence point with respect to the current thermal characterization curve and automatically initiating a remedial action based on the component of the power conversion module associated with the deviation.

In one aspect, the computer readable instructions control the processing device to perform operations further including determining an amount of the deviation with respect to the one or more reference thermal characterization curves, wherein the remedial action is influenced by the component of the power conversion module associated with the deviation and the amount of the deviation. In another aspect, the computer readable instructions control the processing device to perform operations further including determining a rate of change associated with the deviation, wherein the remedial action is influenced by the component of the power conversion module associated with the deviation and the rate of change associated with the deviation. In another aspect, automatically initiating the remedial action involves the processing device automatically initiating generation of a maintenance code associated with the component of the power conversion module. In another aspect, automatically initiating the remedial action involves the processing device automatically initiating generation of a user notification. In another aspect, automatically initiating the remedial action involves the processing device automatically updating a maintenance schedule for a vehicle including the power conversion module. In one or more aspects, the housing includes a plurality of openings for a liquid coolant. In a further aspect, the housing encapsulates a power electronics substrate having the electrical components affixed thereto to provide double-sided cooling and the at least one thermal path includes a plurality of thermal paths including a first thermal path between the power electronics substrate and the housing and a second thermal path between the electrical components and the housing. In another aspect, the one or more reference thermal characterization curves includes an initial thermal characterization curve previously obtained for the power conversion module.

In another aspect, a method of monitoring health of a power conversion module is provided. The method involves a control module operating the power conversion module to conduct a heating current until reaching a steady-state temperature, after reaching the steady-state temperature, obtaining measurement data for an electrical characteristic associated with the power conversion module from one or more sensors associated with the power conversion module, determining a current thermal characterization curve for the power conversion module based on the measurement data, comparing the current thermal characterization curve to one or more reference thermal characterization curves for the power conversion module to identify a deviation associated with the current thermal characterization curve, and in response to identifying the deviation, identifying a component associated with the deviation within at least one thermal path of the power conversion module based on a location of a divergence point with respect to the current thermal characterization curve and automatically initiating a remedial action based on the component of the power conversion module associated with the deviation.

In one aspect, the method further involves determining an amount of the deviation with respect to the one or more reference thermal characterization curves and determining the remedial action based at least in part on the component of the power conversion module associated with the deviation and the amount of the deviation. In another aspect, the method further involves determining a rate of change associated with the deviation and determining the remedial action based at least in part on the component of the power conversion module associated with the deviation and the rate of change associated with the deviation. In another aspect, automatically initiating the remedial action involves the control module automatically initiating generation of a maintenance code associated with the component of the power conversion module. In another aspect, automatically initiating the remedial action involves the control module automatically initiating generation of a user notification. In another aspect, automatically initiating the remedial action involves the control module automatically updating a maintenance schedule for a vehicle including the power conversion module. In one or more aspects, the power conversion module is realized as a double-sided cooled (DSC) power conversion module including electrical components configured to provide a power converter contained within a housing configured to provide a plurality of thermal paths between the electrical components and the housing, wherein the housing includes a plurality of openings for a liquid coolant. In one aspect, the housing encapsulates a power electronics substrate having the electrical components affixed thereto to provide double-sided cooling, and the component associated with the deviation is one of an attachment layer of material between the electrical components and the power electronics substrate and a thermal interface material layer between the power electronics substrate and the housing.

In another aspect, an apparatus for a vehicle is provided. The vehicle includes an electric motor, a power conversion module coupled to the electric motor, wherein the power conversion module includes electrical components configured to provide a power inverter contained within a housing configured to provide double-sided cooling (DSC) having a plurality of thermal paths between the electrical components and the housing, one or more sensors to obtain measurement data for an electrical characteristic associated with the power inverter and a control module coupled to the power conversion module and the one or more sensors. The control module is configured to operate the power inverter to conduct a heating current until reaching a steady-state temperature without producing torque at the electric motor, obtain the measurement data after reaching the steady-state temperature, determine a current thermal characterization curve for the power conversion module based on the measurement data, compare the current thermal characterization curve to one or more reference thermal characterization curves for the power conversion module to identify a deviation associated with the current thermal characterization curve, and in response to identifying the deviation, identify a component associated with the deviation within one of the plurality of thermal paths of the power conversion module based on a location of a divergence point with respect to the current thermal characterization curve and automatically initiate a remedial action based on the component of the power conversion module associated with the deviation.

In one aspect, the vehicle further includes an auxiliary system coupled to the control module, wherein the control module automatically initiates the remedial action by providing an indication of the remedial action to be initiated by the auxiliary system to the auxiliary system. In yet another aspect, the remedial action involves at least one of generation of a maintenance code and illumination of a dashboard indicator.

BRIEF DESCRIPTION OF THE DRAWINGS

The exemplary aspects will hereinafter be described in conjunction with the following drawing figures, wherein like numerals denote like elements, and wherein.

DETAILED DESCRIPTION

The following detailed description is merely exemplary in nature and is not intended to limit the application and uses. Furthermore, there is no intention to be bound by any expressed or implied theory presented in the preceding introduction, summary or the following detailed description.

Figure 1:
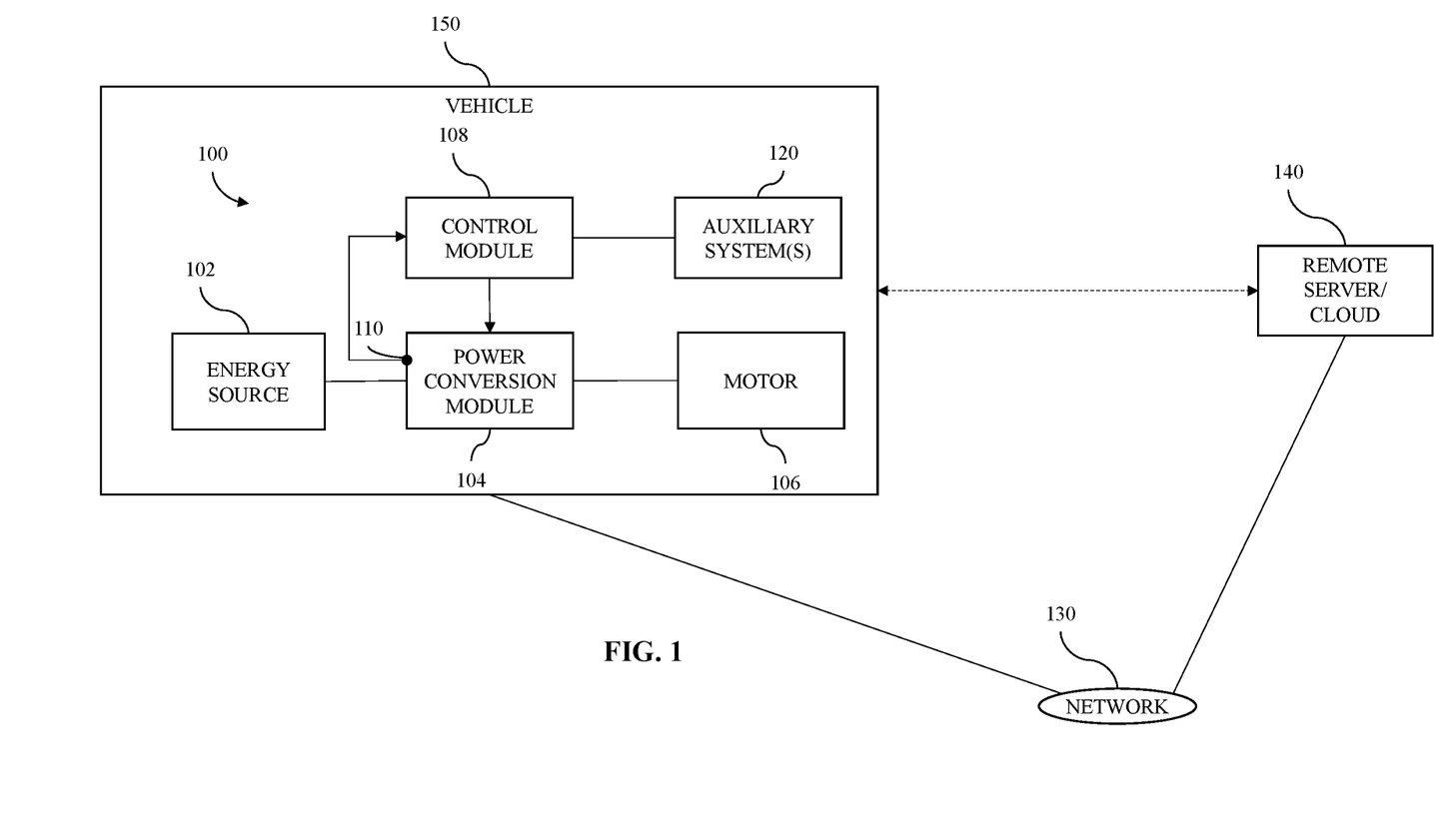
FIG. 1 depicts a block diagram of a vehicle system suitable for use with a vehicle according to one or more aspects described herein.

FIG. 1 depicts an exemplary vehicle system 100 suitable for use in an automotive vehicle 150 that includes, without limitation, an energy source 102, a power conversion module 104, an electric motor 106 and a control module 108. In the illustrated aspect, the control module 108 is coupled to the power conversion module 104 and generates commands for operating the power conversion module 104 in a manner that results in the desired operation of the electric motor 106 in response to commands received from the driver of the vehicle 150 (e.g., via an accelerator pedal). It should be understood that FIG. 1 is a simplified representation of the vehicle system 100 for purposes of explanation and is not intended to limit the scope or applicability of the subject matter described herein in any way. For example, in practical aspects, one or more current sensors may be coupled between the energy source 102 and the power conversion module 104 and/or the between the power conversion module 104 and the electric motor 106 to sense, detect, measure or otherwise quantify a motor current (or a motor phase current) that correlates or otherwise corresponds to the current that flows to/from the energy source 102, and/or vice versa.

In exemplary aspects, the energy source 102 (or power source) generally represents the component in the vehicle 150 that is capable of providing a direct current (DC) voltage to the power conversion module 104 for operating the electric motor 106. Depending on the aspect, the energy source 102 may be realized as a battery, a fuel cell, a rechargeable high-voltage battery pack, an ultracapacitor, or another suitable energy source known in the art. That said, in exemplary aspects, the energy source 102 is realized as one or more rechargeable batteries configured to provide the desired DC voltage for operating the electric motor 106. Accordingly, for purposes of explanation, but without limitation, the energy source 102 may alternatively be referred to herein as a battery.

The power conversion module 104 generally represents the component in the vehicle 150 that is coupled between the energy source 102 and the electric motor 106 to convert the DC power from the energy source 102 into alternating current (AC) power for driving the electric motor 106. In this regard, in exemplary aspects, the power conversion module 104 includes a power inverter having one or more phase legs, with each phase leg corresponding to a respective phase of the electric motor 106. Generally, switches of a phase leg are modulated (opened or closed) at a particular switching frequency to produce an AC voltage across its associated phase of stator windings of the electric motor 106, which, in turn, creates torque-producing current in those stator windings and operates the electric motor 106. For example, for a 3-phase electric motor, the power conversion module 104 may be realized as a DC-to-AC power inverter having three phase legs corresponding to the motor phases, where each phase leg includes a pair of switching elements (or switches) and antiparallel diodes (e.g., electrically in parallel with reversed or inverse polarity) that allows for bidirectional current flow while blocking voltage unidirectionally (e.g., to provide a path for charging current to the energy source 102 when the switches are open or off). In exemplary aspects, the switches are realized using as insulated-gate bipolar transistors (IGBTs); however, in alternative aspects, the switches may be realized as field-effect transistors (e.g., MOSFETs) or another switching device. For purposes of explanation, but without limitation, the power conversion module 104 may alternatively be referred to herein as an inverter module.

In exemplary aspects, the electric motor 106 is realized as an interior permanent magnet (IPM) motor; however, the subject matter described herein should not be construed as being limited to use with any particular type of electric motor. In other aspects, the electric motor 106 may be realized as an induction motor, a synchronous reluctance motor, or another suitable motor known in the art. Although not illustrated in FIG. 1, the motor 106 may be realized as a traction motor that is coupled to or otherwise includes a transmission such that the motor 106 and the transmission are mechanically coupled to at least some of the wheels of the vehicle 150 through one or more drive shafts, so that the speed of the motor 106 (e.g., the rotational velocity of the rotor) influences the speed of the vehicle 150.

In exemplary aspects, the vehicle 150 is realized as an automobile, and depending on the aspect, the vehicle 150 may be any one of a number of different types of automobiles, such as, for example, a sedan, a wagon, a truck, or a sport utility vehicle (SUV), and may be two-wheel drive (2WD) (i.e., rear-wheel drive or front-wheel drive), four-wheel drive (4WD), or all-wheel drive (AWD). Additionally, the vehicle 150 may be realized as a fully electric vehicle, a plug-in hybrid vehicle, a fuel cell vehicle (FCV) or another suitable alternative fuel vehicle, and/or the vehicle 150 may also incorporate any one of, or combination of, a number of different types of engines, such as, for example, a gasoline or diesel fueled combustion engine, a "flex fuel vehicle" (FFV) engine (i.e., using a mixture of gasoline and alcohol), a gaseous compound (e.g., hydrogen and natural gas) fueled engine, and/or a combustion/electric motor hybrid engine.

Still referring to FIG. 1, the control module 108 generally represents the hardware of the vehicle system 100 that is suitably configured to operate the power conversion module 104 to control operation of the motor 106 and periodically diagnose or otherwise monitor the health of the power conversion module 104. Depending on the aspect, the control module 108 may be implemented or realized with an application specific integrated circuit (ASIC), an electronic circuit, a processor (shared, dedicated, or group) and memory that executes one or more software or firmware programs, a combinational logic circuit, a microprocessor, a controller, a microcontroller, a state machine, a field programmable gate array, any suitable programmable logic device, discrete gate or transistor logic, discrete hardware components, or any combination thereof, designed to perform the functions, tasks, operations and/or processes described herein. In this regard, the steps of a method or algorithm described in connection with the aspects disclosed herein may be embodied directly in hardware, in firmware, in a software module executed by the control module 108, or in any practical combination thereof. In exemplary aspects, the control module 108 includes or otherwise accesses a data storage element or memory, including any sort of random-access memory (RAM), read only memory (ROM), flash memory, registers, hard disks, removable disks, magnetic or optical mass storage, or any other short- or long-term storage media or other non-transitory computer-readable medium, which is capable of storing programming instructions for execution by the control module 108. The computer-executable programming instructions, when read and executed by the control module 108, cause the control module 108 to perform various tasks, operations, functions, and processes described herein.

As illustrated in FIG. 1, the control module 108 may be coupled to one or more auxiliary systems 120 (or module(s)) in the vehicle system 100 to output or otherwise provide indicia of the health or potential degradation associated with the power conversion module 104 to the auxiliary module(s) 120. For example, one auxiliary system 120 could be an electronic control unit (ECU) that controls operation of other vehicle modules and/or systems. For example, the ECU may be coupled to a display device or a dashboard indicator that provides a graphical indication to the driver of the vehicle 150 in real-time responsive to an indication of potential degradation associated with the power conversion module 104 from the control module 108. In alternative aspects, the auxiliary system 120 may include or otherwise be realized as a display device or a dashboard indicator that is coupled directly to the control module 108, where the control module 108 dynamically refreshes and/or updates the graphical indication of the health of the power conversion module 104 presented by the display device or a dashboard indicator to reflect the current or most recent diagnostics performed by the control module 108.

As illustrated in FIG. 1, the vehicle system 100 includes one or more sensors 110 associated with the power conversion module 104 that are coupled to the control module 108 to provide measurement data for one or more electrical characteristics pertaining to operation of the power conversion module 104, which, in turn, may also be utilized to monitor the health of the power conversion module 104 as described in greater detail below. For example, in one or more aspects, the one or more sensors 110 includes a voltage sensor that provides voltage measurement data indicative of the voltage across one or more switches of the power conversion module 104. Additionally, or alternatively, the one or more sensors 110 may include one or more current sensors configured to sense, measure, or otherwise quantify the current flowing to/from the energy source 102 and/or the current flowing through a respective phase leg of the power conversion module 104. In some aspects, the one or more sensors 110 include a temperature sensor or thermistor that provides temperature measurement data associated with the power conversion module 104 to the control module 108.

As described in greater detail below in the context of FIG. 3, in exemplary aspects, the processing device associated with the control module 108 executes the computer readable instructions stored by the data storage element associated with or otherwise accessible to the control module 108 to perform a health monitoring process and periodically monitor the transient thermal behavior of the power conversion module 104 to detect or otherwise identify potential degradation and initiate one or more remedial actions. In this regard, the health monitoring process may be initiated or otherwise performed by the control module 108 when in response to detecting that the vehicle 150 is idling, coasting, in park, or exhibiting some other diagnostic condition where the power conversion module 104 does not need to be operated to provide power to the motor 106. To monitor the power conversion module 104, the control module 108 operates the circuitry of the power conversion module 104 to conduct electrical current from the energy source 102 that is configured generate heat without producing torque at the motor 106 until reaching a substantially steady-state temperature. After reaching the steady-state temperature, the control module 108 operates the circuitry of the power conversion module 104 to conduct a reduced amount of electrical current from the energy source 102 while obtaining voltage and/or current measurement data from the sensor(s) 110. The control module 108 then converts the obtained measurement data with respect to time into a corresponding thermal characterization curve that represents the relationship between the thermal capacitance and thermal resistance of the power conversion module 104 that was exhibited by the obtained measurement data with respect to time while providing reduced current flow.

The current (or most recent) thermal characterization curve for the power conversion module 104 determined by the control module 108 is compared to one or more reference thermal characterization curves for the power conversion module 104 to identify a deviation associated with the current thermal characterization curve with respect to the reference thermal characterization curve(s) that exceeds a degradation detection threshold. When the deviation exceeds the degradation detection threshold, the control module 108 analyzes the relationship between the current thermal characterization curve and the reference thermal characterization curve(s) to identify the location along the current thermal characterization curve where the current thermal characterization curve begins deviating from the reference thermal characterization curve(s). Based on the location where the current thermal characterization curve begins deviating, the control module 108 identifies or otherwise determines which component within a thermal path of the power conversion module 104 is likely responsible for or otherwise associated with the deviation, and then initiates one or more remedial actions based on the identified component. In exemplary aspects, the control module 108 logs or otherwise records the identification of the component responsible for the deviation in association with the particular thermal characterization curve and provides one or more commands, signals, instructions or other indicia to one or more auxiliary systems 120 associated with the vehicle 150 to initiate one or more remedial actions.

In one or more exemplary aspects, the remedial action(s) initiated by the control module 108 in response to identifying a deviation indicative of potential degradation of a component in a thermal path of the power conversion module 104 may vary depending on the particular component responsible for the deviation, the amount of the deviation, the rate of change associated with the deviation and/or the frequency of occurrence of the deviation. For example, when the identified component is less operationally significant, when the amount of the deviation is relatively smaller (e.g., greater than a detection threshold but less than an escalation threshold), when the rate of change associated with the deviation is slower (e.g., based on the relationship between the current thermal characterization curve and one or more preceding thermal characterization curves) and/or the frequency of occurrence of the deviation is relatively low (e.g., less than a threshold number of occurrences), the control module 108 may automatically initiate generation of a maintenance code associated with the component of the power conversion module 104 and/or automatically update a maintenance schedule associated with the vehicle 150 to include or incorporate maintenance with respect to the component of the power conversion module 104 during the next maintenance event. On the other hand, when the identified component is more operationally significant, when the amount of the deviation is relatively larger (e.g., greater than an escalation threshold), when the rate of change associated with the deviation is faster and/or the frequency of occurrence of the deviation is relatively high (e.g., greater than a threshold number of occurrences), the control module 108 may automatically initiate generation of a user notification that alerts the driver or other operator of the vehicle 150 of a potential maintenance issue (e.g., by illuminating a check engine light or one or more dashboard indicators) and/or automatically update a maintenance schedule associated with the vehicle 150 to expedite maintenance with respect to the component of the power conversion module 104 (e.g., by advancing the next maintenance event forward in time). In this regard, it should be appreciated that there are numerous different potential combinations of remedial actions and corresponding schemes, thresholds and/or logic rules for generating such remedial actions, and the subject matter described herein is not intended to be limited to any particular implementation.

Still referring to FIG. 1, in one or more exemplary aspects, the vehicle 150 includes a communications system or interface that supports communications with a remote processing system 140 over a communications network 130. The remote processing system 140 generally represents a central server, a remote server, a cloud computing system or any other sort of remote processing system capable of communicating over the network 130. In this regard, the remote processing system includes a processing system, which could be realized using any sort of processor, controller, central processing unit, graphics processing unit, microprocessor, microcontroller and/or a combination thereof that is suitably configured to support the subject matter described herein. The remote processing system 140 may also include or otherwise access a data storage element, which could be realized as any sort of memory (e.g., a random-access memory, a read-only memory, etc.), data store (e.g., a solid-state drive, a hard disk drive, mass storage, etc.), database or the like that is capable of storing or otherwise maintaining thermal characterization curves and other data to support the subject matter described herein.

The network 130 represents any one or a combination of different types of suitable communications networks such as, for example, cable networks, public networks (e.g., the Internet), private networks, wireless networks, cellular networks, or any other suitable private and/or public networks. Further, the network 130 can have any suitable communication range associated therewith and may include, for example, global networks (e.g., the Internet), metropolitan area networks (MANs), wide area networks (WANs), local area networks (LANs), or personal area networks (PANs). In addition, the network 130 can include any type of medium over which network traffic may be carried including, but not limited to, coaxial cable, twisted-pair wire, optical fiber, a hybrid fiber coaxial (HFC) medium, microwave terrestrial transceivers, radio frequency communication mediums, satellite communication mediums, or any combination thereof. According to one or more aspects described herein, the control module 108 and/or one or more auxiliary systems 120 onboard the vehicle 150 communicate with the remote processing system 140 via a vehicle-to-infrastructure (V2I), vehicle-to-vehicle (V2V), vehicle-to-pedestrian (V2P), and/or vehicle-to-grid (V2G) communication.

In one or more aspects, the control module 108 retrieves or otherwise obtains data pertaining to the one or more reference thermal characterization curve(s) from the remote processing system 140, and uploads or otherwise transmits data pertaining to the thermal characterization curves determined by the control module 108 at the vehicle 150 to the remote processing system 140 for storage and/or analysis. In this regard, the remote processing system 140 may utilize machine learning, artificial intelligence and/or other big data techniques to analyze thermal characterization curves for different instances of the power conversion module 104 over time from multiple different instances of the vehicle 150 to determine appropriate thresholds for detecting deviations and/or initiating remedial actions based on the thermal characterization curves. For example, if a particular component in a thermal path of the power conversion module 104 is identified as potentially degraded with relatively low frequency or few incidences of occurrence across a relatively large number of vehicles 150, or the rate of change associated with the deviations attributable to that component is relatively slow, the remote processing system 140 may determine that the potential degradation exhibited by that particular component is idiosyncratic or otherwise particular to individual driving behaviors and/or the like. On the other hand, if a particular component in a thermal path of the power conversion module 104 is identified as potentially degraded with relatively high frequency or higher incidences of occurrence, or the rate of change associated with the deviations attributable to that component is relatively fast, the remote processing system 140 may proactively determine updated maintenance schedules for the entire fleet of vehicles 150 or schedule a recall to replace or perform maintenance on the power conversion module 104 across multiple vehicles 150. In such scenarios, the amount of deviation exhibited by different vehicles 150 may be utilized to divide vehicles 150 into groups corresponding to the relative amount of potential degradation exhibited by the respective vehicles 150 classified into a respective group, thereby allowing maintenance or other remedial actions to be expedited according to the amount of deviation exhibited. Analysis of the thermal characterization data at the remote processing system 140 may also be utilized to change one or more components of the power conversion module 104 (or suppliers associated therewith) or otherwise update or redesign the thermal paths of the power conversion module 104 to reduce potential degradation. In some aspects, the remote processing system 140 may utilize a previously-obtained subset of thermal characterization curves obtained from different vehicles 150 to train or otherwise develop one or more artificial intelligence and/or machine learning models, which, in turn, may be utilized to predictively forecast future degradation or generate other predictions or output data that may be utilized by other services (e.g., insurance services) in response to subsequently-obtained thermal characterization curves. In this regard, it should be appreciated that there are numerous different potential machine learning, artificial intelligence and/or other big data techniques that may be utilized by the remote processing system 140 to initiate and/or facilitate one or more remedial actions, and the subject matter described herein is not intended to be limited to any particular implementation.

Figure 2:
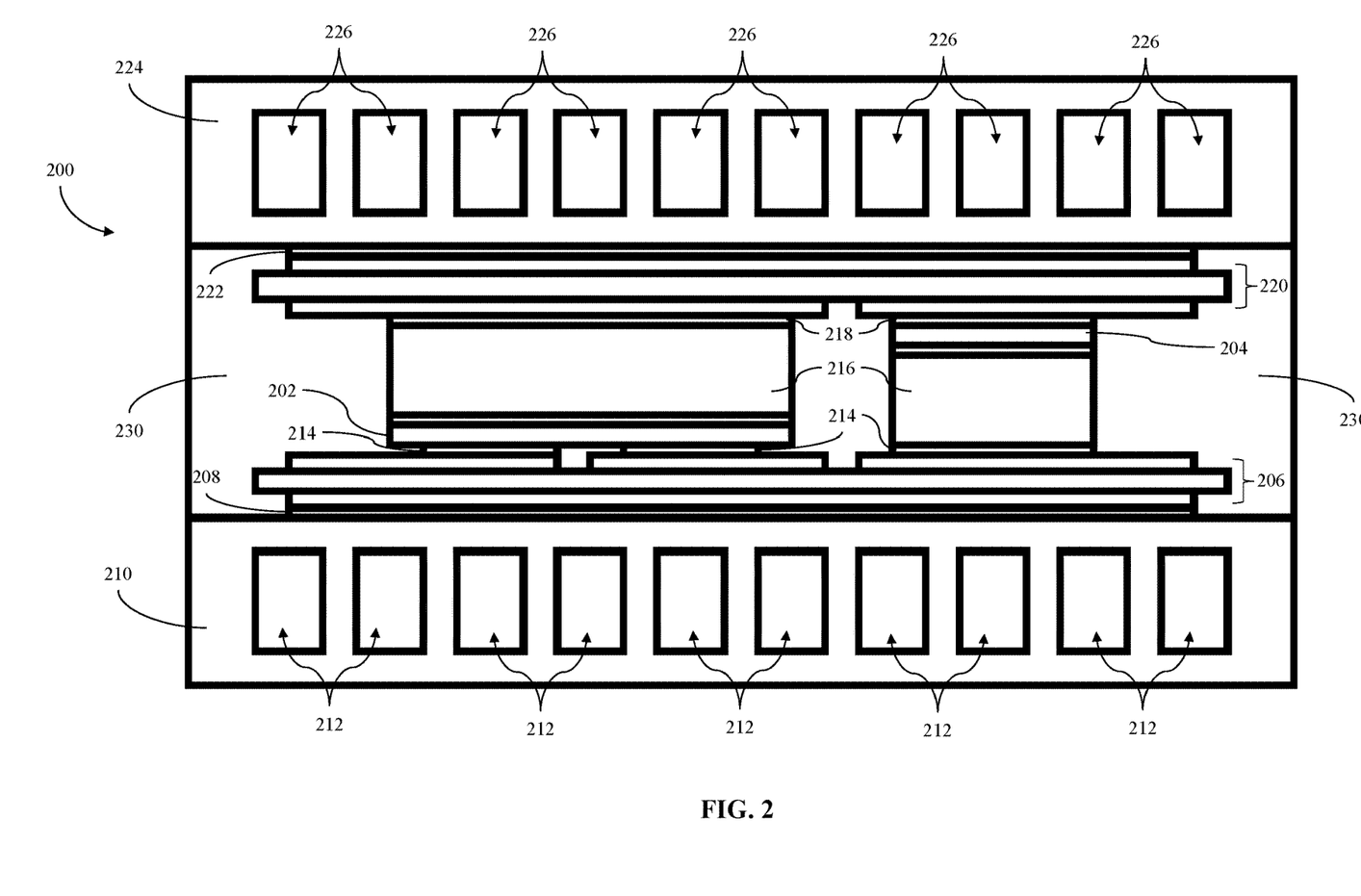
FIG. 2 depicts a cross-sectional view of a power conversion module with double-sided cooling (DSC) suitable for use in the vehicle system of FIG. 1 according to one or more aspects described herein.

FIG. 2 depicts a cross-sectional view of an exemplary aspect of a power conversion module 200 suitable for use as the power conversion module 104 in the vehicle system 100 of FIG. 1. The power conversion module 200 is realized as a double-sided cooled (DSC) module that incorporates liquid coolant on opposite sides of the electrical components 202, 204 and power electronics substrates 206, 220 that are configured to function as the inverter (or power converter) of the power conversion module 104. A mounting surface of the first power electronics substrate 206 is affixed or otherwise adhered to a first housing portion 210 via an intermediate thermally conductive thermal interface material (TIM) layer 208. The housing portion 210 is realized as a metal or other thermally conductive material suitable for functioning as a heat sink and configured as a cooling jacket that includes a plurality of voids or openings 212 configured to provide one or more channels for receiving a liquid coolant that is injected or otherwise circulated through the channel(s) defined by the openings 212 to cool the power electronics substrate 206. In the illustrated example, the electrical components 202, 204 are fabricated on semiconductor dies that are affixed or otherwise mounted to the opposing surface of the respective power electronics substrate 206, 220 that is configured to provide flat-paneled electrical connections to/from the electrical components 202, 204 via a die attachment layer 218 of electrically and thermally conductive material that bonds the electrical components 202, 204 to the power electronics substrate 206, such as a silver paste or solder paste formed via a silver sintering process. In practice, the respective power electronics substrate 206, 220 also includes or otherwise incorporates routing, conductive traces or other connections configured to provide the inverter circuit in concert with the electrical components 202, 204. For example, one or more IGBTs of the inverter phase leg(s) may be formed or otherwise fabricated on a first die mounted to the first power electronics substrate 206 while one or more freewheeling diodes of the inverter phase leg(s) may be formed or otherwise fabricated on a second die 204 mounted to the second power electronics substrate 220, with the power electronics substrates 206, 220 being configured to provide the routing and interconnections between the IGBTs and the diodes to provide an inverter circuit.

The physical contact between the electrical components 202, 204, the respective die attachment layer 214, 218, the respective power electronics substrate 206, 220, the respective TIM layer 208, 222 and the respective housing portion 210, 224 provides a thermal path that facilitates cooling the electrical components 202, 204 from the substrate side with the liquid coolant via the openings 212, 226 in the respective housing portion 210, 224. To facilitate double-sided cooling of the electrical components 202, 204, a layer of spacer material 216 is provided on the topside surface of the electrical components 202, 204. The spacer material 216 is mounted, affixed or otherwise adhered to the topside surface of a respective electrical component 202, 204 and an opposing one of the power electronics substrates 206, 220 via a layer of conductive material (e.g., solder paste or silver paste via a silver sintering process). In this manner, the spacer material 216 provides another thermal path from the topside surface of a respective electrical component 202, 204 to the opposing power electronics substrate 206, 220 and housing portion 210, 224. Although not illustrated in FIG. 2, in some aspects, the power electronics substrates 206, 220 may include or otherwise have mounted thereon additional electrical components or semiconductor dies associated with the power converter, and the power electronics substrates 206, 220 may be configured provide corresponding routing, conductive traces or other interconnections between those components.

The opposing surface of the power electronics substrate 220 is affixed or otherwise adhered to the second housing portion 224 via TIM layer 222. The second housing portion 224 similarly includes a plurality of voids or openings 226 that provide one or more channels for receiving liquid coolant that is injected or otherwise circulated through the openings 226 to cool the power electronics substrate 220 from the side opposite the first housing portion 210 by virtue of the thermal path provided by physical contact between the electrical components 202, 204, the spacer material 216, the die attachment layer 218, the power electronics substrate 220, the TIM layer 222 and the housing portion 224. In exemplary aspects, an encapsulating material 230, such as an epoxy molding compound or other molding material, is formed or otherwise provided to fill any spaces between the substrates 206, 220 and thereby encapsulate and protect the electrical components 202, 204 and the substrates 206, 220 from environmental elements.

It should be noted that in contrast to single-sided cooling, the DSC power conversion module 200 includes multiple thermal paths and results in a thinner and flatter power conversion module 200 (e.g., where the ratio of the thickness is less than one tenth of the linear dimension). Additionally, the DSC power conversion module 200 may incorporate silver sintering (rather than soldering) and flat-paneled electrical connections (rather than wire bonding) that may reduce the size, shape and/or dimensions of the DSC power conversion module 200 while also eliminating potential points of degradation. That said, the DSC power conversion module 200 thermal paths are capable of characterization by a structure function to map thermal performance to the physical structure of the DSC power conversion module 200, and thereby allow identification of the particular component within a thermal path of the DSC power conversion module 200 associated with potential degradation, as described in greater detail below.

Figure 3:
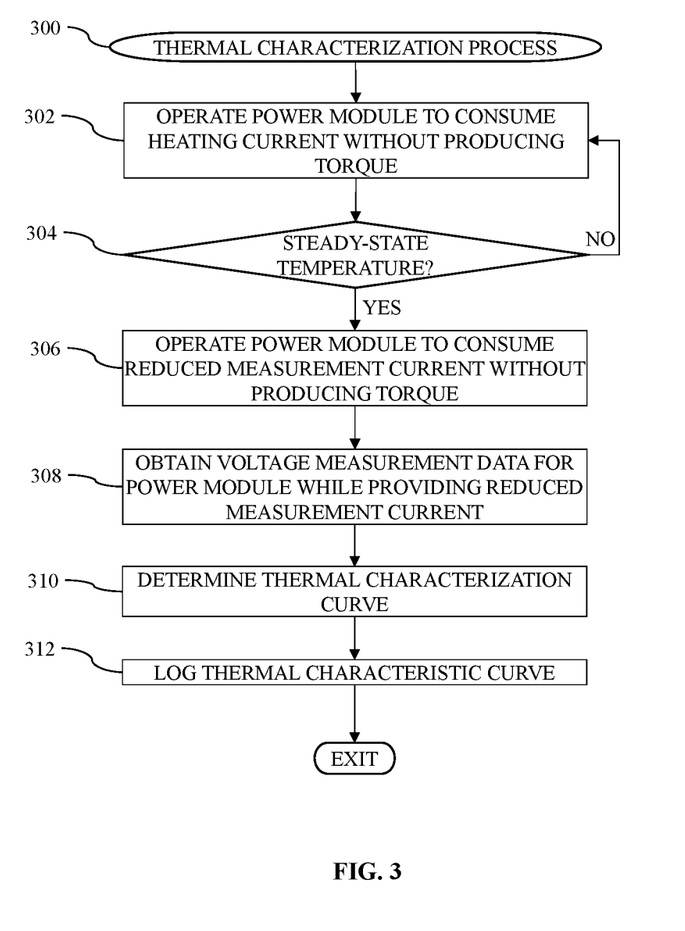
FIG. 3 depicts a flow diagram of a thermal characterization process suitable for implementation by the vehicle system of FIG. 1 according to one or more aspects described herein.

FIG. 3 depicts an exemplary aspect of a thermal characterization process 300 suitable for implementation by a control module onboard a vehicle to characterize thermal characteristics of a power conversion module during operation of the vehicle to support related health monitoring processes, tasks, operations and/or related functions described herein. For illustrative purposes, the following description may refer to elements mentioned above in connection with FIG. 1. While portions of the thermal characterization process 300 may be performed by different elements of a vehicle system, for purposes of explanation, the subject matter may be primarily described herein in the context of the thermal characterization process 300 being primarily performed by the control module 108. In one or more exemplary aspects, the thermal characterization process 300 is performed in connection with the health monitoring process 400 described in greater detail below in the context of FIG. 4.

In exemplary aspects, the control module 108 automatically initiates the thermal characterization process 300 during operation of the vehicle 150 to periodically obtain an updated thermal characterization curve for the power conversion module 104 to provide substantially real-time, onboard health monitoring of the power conversion module 104. For example, in some aspects, the control module 108 may be configured to automatically initiate the thermal characterization process 300 during operation of the vehicle 150 on a periodic basis (e.g., hourly, daily, weekly, monthly, etc.) when the vehicle 150 is operated in a state in which the motor 106 does not need to be operated to provide traction (e.g., when the vehicle 150 is in park, neutral, idling, coasting and/or the like). In other aspects, the control module 108 may automatically initiate the thermal characterization process 300 whenever the vehicle 150 enters a state in which the motor 106 does not need to be operated to provide traction. In this regard, there are numerous different combinations of criteria or rules that may be utilized by the control module 108 to automatically initiate the thermal characterization process 300 during operation of the vehicle 150 with a desired frequency, and the subject matter described herein is not intended to be limited to any particular implementation.

The thermal characterization process 300 initializes or otherwise begins at 302 by the control module 108 operating the power conversion module 104 to consume or otherwise conduct an electrical current in a manner that generates heat, and thereby heats the power conversion module 104, without producing torque at the motor 106 during a heating phase until the power conversion module 104 reaches a steady-state temperature at 304. In this regard, during the power conversion module heating phase, the control module 108 injects a continuous heating current from the energy source 102 through one or more of the phase legs of the power inverter circuitry inside the power conversion module 104, thereby heating the power inverter electrical components 202, 204 by virtue of the current flow through those components 202, 204. For example, in one aspect, the control module 108 operates the IGBTs of the power inverter in a manner that results in substantially the same amount of heating current to flow through each phase leg of the power inverter, and thereby each phase of the motor 106, which results in zero torque production at the motor 106 by virtue of the equilibrium across the motor phases. That said, in other aspects, where the motor 106 is realized as a permanent magnet motor, the control module 108 obtains rotor position measurement data from a rotor position sensor and then operates the IGBTs of the power inverter to consume or otherwise conduct a heating current that is 90° out of phase of the current rotor position of the motor 106, thereby resulting in zero torque production at the motor 106. In some aspects, the control module 108 operates the power conversion module 104 to consume the heating current for a fixed duration of time that is calibrated or otherwise configured to result in the power conversion module 104 achieving a substantially steady-state temperature. That said, in other aspects, when the one or more sensors 110 include a temperature sensor or thermistor that provides temperature measurement data associated with the power conversion module 104, the control module 108 may monitor the temperature measurement data to detect or otherwise identify when the power conversion module 104 reaches a steady-state temperature (e.g., when the measured temperature is substantially constant across a threshold number of samples).

Once the steady-state temperature is reached, the thermal characterization process 300 operates the power conversion module 104 to consume or otherwise conduct a reduced measurement reference current without producing torque at the motor 106 at 306 while concurrently receiving or otherwise obtaining voltage measurement data for the power conversion module 104 while providing the reduced measurement reference current at 308. In this regard, upon reaching the steady-state temperature, the control module 108 ceases operating the power inverter to consume the heating current and instead operates the power inverter to consume a reduced measurement reference current (e.g., 100 mA) that maintains current flow through the power conversion module 104 while allowing the temperature of the power conversion module 104 to fall from the elevated steady-state temperature resulting from the heating current. While the reduced measurement reference current is provided and the power conversion module 104 cools, the control module 108 receives or otherwise obtains voltage measurement data from a voltage sensor 110 associated with the power conversion module 104 during the cooling phase (or cool down phase). For example, the voltage sensor 110 may be configured to measure the forward voltage across one or more switching elements of the power inverter (e.g., the collector-to-emitter voltage (VcE) across one or more IGBTs, the drain-to-source voltage (VD's) across one or more metal-oxide-semiconductor field-effect transistors (MOSFETs), etc.).

Based on the relationship between the voltage measurement data and the reduced measurement reference current during the power conversion module cooling phase following the heating current, the thermal characterization process 300 calculates or otherwise determines a corresponding thermal characterization curve at 310. In this regard, the control module 108 maps or otherwise converts the relationship between the measured voltage and the reduced measurement reference current with respect to time during the cooling phase into a corresponding relationship between the thermal resistance and the thermal capacitance of the power conversion module 104 that is reflected by the transient changes in the measured voltage across one or more IGBTs of the power inverter during the cooling phase while the constant measurement reference current is provided. In an exemplary aspect, the thermal characterization curve is realized as a structure function that corresponds to the physical structure of the power conversion module 104 based on the relationship between thermal capacitance and thermal resistance. To derive the structure function, the control module 108 performs deconvolution and other mathematical operations on the sequence of voltage measurement data samples with respect to time to derive continuous spectrum of one or more time constants corresponding to the thermal paths of the power conversion module 104, which, in turn may be utilized to derive the relationship between thermal capacitance and thermal resistance corresponding to the time constants. For example, in one implementation, the control module 108 converts the sequence of voltage measurement data samples into a thermal impedance curve which is deconvoluted to derive a continuous spectrum of time constants, which in turn are utilized to convert the thermal impedance curve to an equivalent Foster thermal network. The Foster thermal network equivalent is then transformed into a Cauer thermal network equivalent, from which cumulative and derivative structure functions can be derived. The resulting thermal characterization curve corresponding to the cumulative structure function includes a sequence of thermal capacitance and thermal resistance value pairs that reflect the structure of the thermal paths of the power conversion module 104. In one or more implementations, the thermal characterization curve is determined using a structure function that represents the unidirectional heat flow from the heat source to a heat sink. In this regard, a unidirectional structure function is utilized even though the DSC power conversion module includes multiple different thermal paths away from the heat source, and even though the reduced thickness and/or aspect ratio that might otherwise support lateral thermal spreading or low resolution.

Still referring to FIG. 3, after deriving the thermal characterization curve, the thermal characterization process 300 logs or otherwise records the thermal characterization curve at 312. In this regard, the control module 108 may store or otherwise record the thermal capacitance and thermal resistance value pairs of the thermal characterization curve in association with a timestamp associated with the iteration of the thermal characterization process 300. In some aspects, the control module 108 may also store or otherwise maintain the voltage measurement data associated with the cooling phase of the current iteration of the thermal characterization process 300 in association with the corresponding thermal characterization curve data and timestamp(s) for the current iteration of the thermal characterization process 300. Moreover, in some aspects, the control module 108 may upload or otherwise transmit the thermal characterization curve data and/or the cooling phase voltage measurement data associated with the current iteration of the thermal characterization process 300 to the remote processing system 140 over the network 130 to support analysis at the remote processing system 140.

Figure 4:
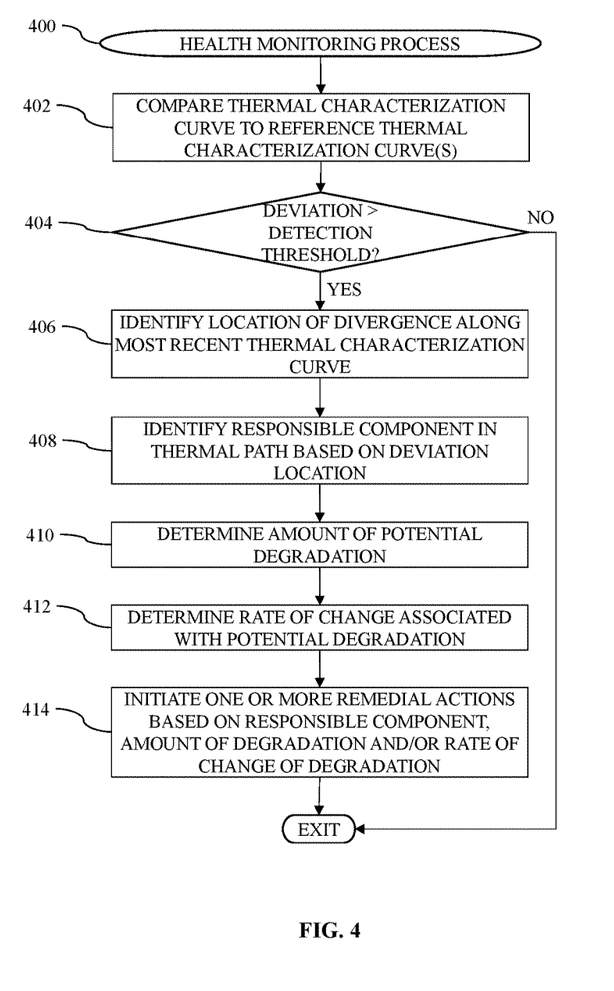
FIG. 4 depicts a flow diagram of a health monitoring process suitable for implementation by the vehicle system of FIG. 1 in connection with the thermal characterization process of FIG. 3 according to one or more aspects described herein.

FIG. 4 depicts an exemplary aspect of a health monitoring process 400 suitable for implementation by a vehicle system in connection with the thermal characterization process 300 to detect or otherwise identify potential degradation of a component in a thermal path associated with a power conversion module and initiate one or more remedial actions. For illustrative purposes, the following description may refer to elements mentioned above in connection with FIG. 1. While portions of the health monitoring process 400 may be performed by different elements of a vehicle system, for purposes of explanation, the subject matter may be primarily described herein in the context of the health monitoring process 400 being primarily performed by the control module 108. That said, in other aspects, the health monitoring process 400 may be implemented or performed at the remote processing system 140, or the health monitoring process 400 may be implemented in a distributed manner across the remote processing system 140, the control module 108 and/or the auxiliary systems 120.

In one or more exemplary aspects, the health monitoring process 400 is automatically initiated or otherwise performed in response to obtaining a new or updated thermal characterization curve for a power conversion module to diagnose the health of the power conversion module substantially in real-time. The health monitoring process 400 compares the current (or most recent) thermal characterization curve to one or more reference curves at 402 to detect, identify or otherwise determine when a deviation between the current thermal characterization curve and the reference thermal characterization curve(s) exceeds a degradation detection threshold at 404. In this regard, the reference thermal characterization curve(s) may include one or more previously-obtained thermal characterization curves for the power conversion module 104. For example, the thermal characterization process 300 may be performed for the power conversion module 104 upon initial deployment to the vehicle 150 or as a back end of line (BEOL) process step to obtain an initial reference thermal characterization curve that reflects the initial, known healthy state of the power conversion module 104 prior to usage in the vehicle 150. The initial (or healthy) reference thermal characterization curve data may be stored or otherwise maintained by the control module 108 at the vehicle 150 or at the remote processing system 140 for subsequent retrieval. In such aspects, the health monitoring process 400 detects or otherwise identifies when the current state of the power conversion module 104 has potentially degraded from the initial, healthy state. Additionally, or alternatively, the reference thermal characterization curve(s) may be realized as one or more preceding thermal characterization curves to accommodate gradual aging over time, such that the health monitoring process 400 detects or otherwise identifies when the current state of the power conversion module 104 has more rapidly changed from the preceding state. When any deviations between the current (or most recent) thermal characterization curve and the reference thermal characterization curve(s) are less than (or within) a degradation detection threshold, the health monitoring process 400 may designate the power conversion module as healthy and exit.

When the health monitoring process 400 identifies a deviation between the current thermal characterization curve and a reference thermal characterization curve that exceeds a degradation detection threshold, the health monitoring process 400 identifies or otherwise determines the location of a divergence point where the current thermal characterization curve begins deviating from the reference thermal characterization curve at 406. Based on the location of the divergence point along the current thermal characterization curve, the health monitoring process 400 identifies or otherwise determines the component in a thermal path of the power conversion module that is potentially degraded and most likely to be responsible for the deviation at 408. In some implementations, a differential structure function may be utilized to identify the location of the divergence point.

As described above in the context of FIG. 3, in exemplary aspects, the thermal characterization curve is realized as a structure function that corresponds to the physical structure of the power conversion module 104, 200, where the divergence in thermal capacitance and/or thermal resistance can be mapped to potential degradation or aging of a particular component in a thermal path of the power conversion module 104. In this regard, the thermal resistance value where the current thermal characterization curve begins deviating from the reference thermal characterization curve by more than the degradation detection threshold may be mapped to a particular component (or a particular interface between components) in a thermal path of the power conversion module 104.

Figure 5:
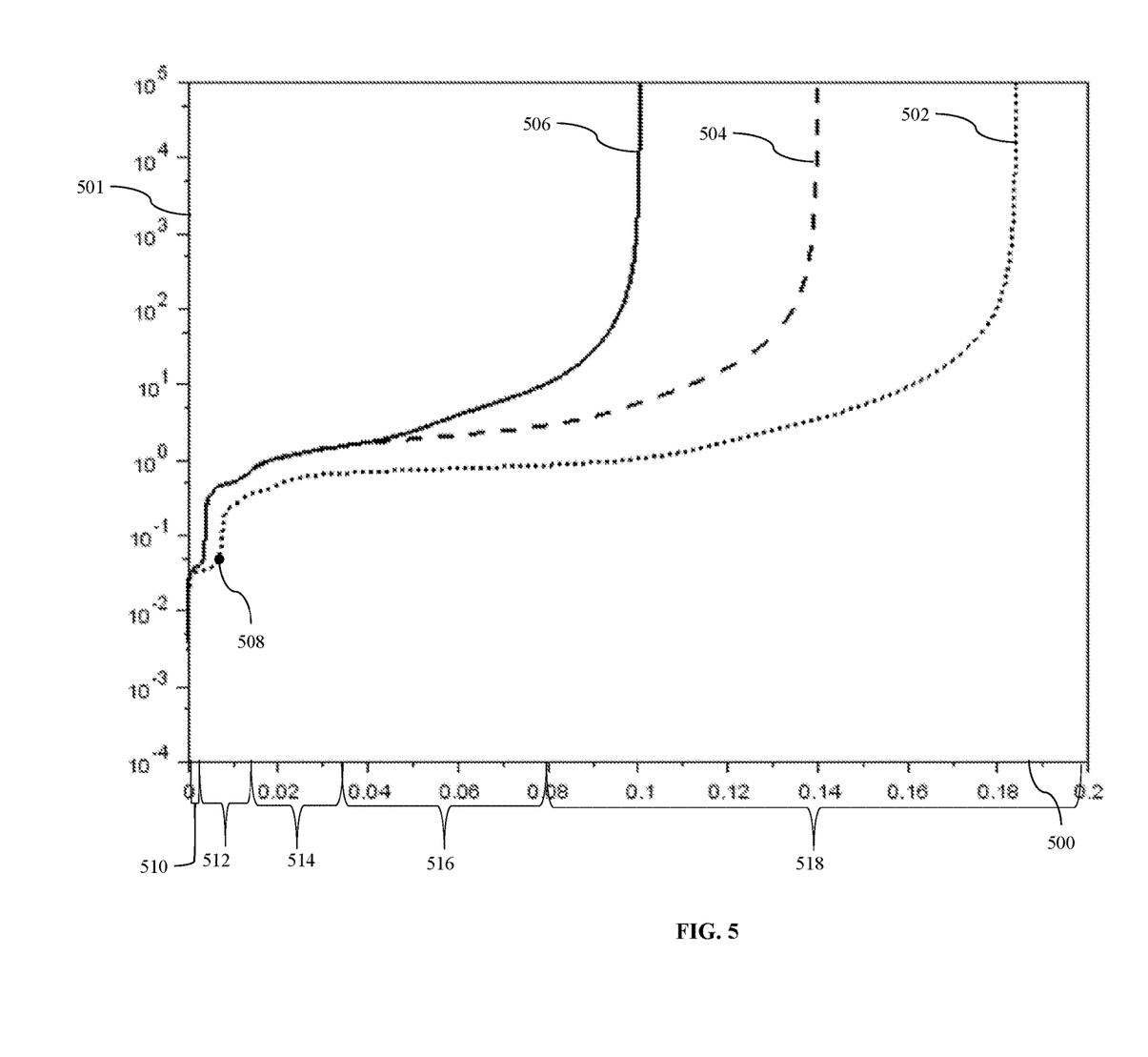
FIG. 5 is a graph depicting thermal characterization curves for an example implementation of the health monitoring process of FIG. 4 according to one or more aspects described herein.

FIG. 5 depicts an exemplary graph of relationships between different recent or updated thermal characterization curves 502, 504 currently under analysis pursuant to the health monitoring process 400 and a reference thermal characterization curve 506 utilized by the health monitoring process 400. In this regard, the reference thermal characterization curve 506 may correspond to an initial thermal characterization curve determined for the power conversion module 104, 200 from a prior instance of the thermal characterization process 300 upon initial deployment to the vehicle 150, while the updated thermal characterization curves 504, 506 represent more recent iterations of the thermal characterization process 300 and the substantially real-time state of the power conversion module 104, 200 during a subsequent instance of operation of the vehicle 150. The horizontal axis 500 corresponds to thermal resistance and the vertical axis 501 corresponds to thermal capacitance.

As described above, the thermal characterization curves 502, 504, 506 represent the transformation of the voltage measurement data obtained at 308 of the thermal characterization process 300 into a corresponding unidirectional structure function at 310. The unidirectional thermal characterization curves 502, 504, 506 originate, emanate or are otherwise referenced from the heat source (e.g., the electrical components 202, 204 of the power conversion module 104, 200), where increasing thermal resistance along the horizontal axis 500 corresponds to increasing physical distance (and corresponding heat dissipation) from the heat source utilized to provide the step response from which the thermal characterization curves 502, 504, 506 are derived. In this regard, even though a DSC power conversion module 104, 200 includes multiple bidirectional thermal paths for dissipating heat from the electrical components 202, 204, the deconvoluted unidirectional structure function can be utilized to map divergence points to physical locations within the DSC power conversion module 104, 200 and corresponding components (or component interfaces) by virtue of the symmetry of the physical structure of the DSC power conversion module 104, 200. Thermal characterization curve 502 represents the unidirectional structure function resulting from the thermal characterization process 300 when degradation or another anomalous condition associated with the die attachment layer 214 exists, while thermal characterization curve 504 depicts the unidirectional structure function resulting from the thermal characterization process 300 when degradation or another anomalous condition associated with the TIM layer 208 exists.

Still referring to FIG. 5, with continued reference to FIGS. 1-4, in the scenario where curve 502 represents the current (or most recent) thermal characterization curve under analysis pursuant to the health monitoring process 400, the control module 108 identifies the location of a divergence point 508 along the current thermal characterization curve 502 where the difference in the thermal resistance measured along the horizontal axis 500 between the curves 502, 506 first exceeds the degradation detection threshold, and then identifies the component of the DSC power conversion module 104, 200 that is associated with that particular location. In this regard, different regions or ranges 510, 512, 514, 516, 518 of thermal resistance values along the reference thermal characterization curve 506 may be mapped or otherwise correlated to different components within the thermal paths of the DSC power conversion module 104, 200. For example, for the unidirectional structure function that emanates from the electrical components 202, 204, an initial range 510 of thermal resistance values may correspond to potential degradation at the electrical components 202, 204, the next range 512 of thermal resistance values may correspond to the die attachment layers 214, 218 (e.g., the electrically conductive material utilized to attach the electrical components 202, 204 to the power electronics substrates 206, 220), the next range 514 of thermal resistance values may correspond to the power electronics substrates 206, 220, the next range 516 of thermal resistance values may correspond to the TIM layers 208, 222 utilized to attach the power electronics substrates 206, 220 to the respective housing portion 210, 224, and the last range 518 of thermal resistance values may correspond to the respective housing portion 210, 224. In this regard, by virtue of the location of the divergence point 508 residing within the range 512 associated with the die attachment layer 214, 218, the control module 108 identifies a die attachment layer 214, 218 as the component within the thermal path that the potential degradation is attributable to. Similarly, in the scenario where curve 504 represents the current (or most recent) thermal characterization curve under analysis pursuant to the health monitoring process 400, the control module 108 identifies the location of the divergence point along the current thermal characterization curve 504 where the difference in the thermal resistance measured along the horizontal axis 500 between the curves 504, 506 first exceeds the degradation detection threshold as being within the TIM layer region 516, and then identifies a TIM layer 208, 222 as the component within the thermal path that the potential degradation is attributable to.

Referring again to FIG. 4, with continued reference to FIGS. 1-3 and 5, in exemplary aspects, the health monitoring process 400 also calculates or otherwise determines an amount of potential degradation based on the difference between the thermal characterization curves at 410, that is, the amount of drift in thermal resistance from the reference thermal characterization curve to the current thermal characterization curve under analysis. In this regard, the control module 108 may calculate or otherwise determine the distance in thermal resistance measured along the horizontal axis 500 between the divergence point 508 along thermal characterization curve 502 and the reference thermal characterization curve 506. In some aspects, the control module 108 determines a percentage representing the amount of potential degradation by dividing the distance (or difference in thermal resistance) between the divergence point 508 and the reference thermal characterization curve 506 by the expected thermal resistance at that location (e.g., the common thermal capacitance value along the vertical axis 501) defined by the reference thermal characterization curve 506, such that larger deviations closer to the electrical components 202, 204 within the thermal path result in a higher amount of potential degradation relative to similar deviations further from the electrical components 202, 204 within the thermal path at higher thermal resistance values.

In some exemplary aspects, the health monitoring process 400 also calculates or otherwise determines rate of change associated with the potential degradation based on the relationship between the current thermal characterization curve and one or more preceding thermal characterization curves at 412. For example, based upon the amount of time elapsed between the current thermal characterization curve and a preceding thermal characterization curve, the control module 108 may calculate or otherwise determine a rate of change associated with the potential degradation by dividing the distance or difference in thermal resistance between the identified divergence point 508 and a corresponding location along the preceding thermal characterization curve (e.g., the change in thermal resistance drift) by the amount of time elapsed (or change in time) between iterations of the thermal characterization process 300. In this regard, the rate of change (or thermal resistance drift) associated with the potential degradation corresponds to how quickly the identified component appears to be degrading or aging.

After identifying the potentially degraded component, the amount of degradation, and/or the rate of change associated with the potential degradation, the health monitoring process 400 automatically initiates one or more remedial actions that are commensurate with the observed potential degradation at 414. For example, when the control module 108 identifies a divergence point within one of the ranges (or regions) 510, 512, 514 corresponding to locations or components of the DSC power conversion module 104, 200 that more closely relate to the functionality of the power conversion module 104, 200, the control module 108 may communicate with the auxiliary system(s) 120 and/or the remote processing system 140 to automatically initiate generation of an alert or similar user notification that notifies the operator of the vehicle 150 of a potential issue with respect to operation of the vehicle 150, automatically schedule maintenance and/or the like to facilitate expeditious maintenance of the power conversion module 104, 200. On the other hand, when the divergence point is located within a range 516, 518 associated with a component that is related to the thermal management of the power conversion module 104, 200 (e.g., the TIM layer 208 or the housing portion 210), the control module 108 may communicate with the auxiliary system(s) 120 and/or the remote processing system 140 to automatically generate one or more maintenance codes or automatically update a maintenance schedule to facilitate maintenance of the power conversion module 104, 200 in a manner that does not distract the operator of the vehicle 150 during vehicle operation. That said, when the amount of the deviation and/or the rate of change associated with the deviation of the divergence point is greater than one or more escalation thresholds, the control module 108 may communicate with the auxiliary system(s) 120 and/or the remote processing system 140 to automatically initiate generation of an alert or similar user notification that notifies the operator of the vehicle 150 of a potential issue with respect to operation of the vehicle 150 even if the identified component responsible for the potential degradation is not part of the power conversion circuitry.

As described above, in practice, the control module 108 may log or otherwise store the thermal characterization curve in association with the identified component, the amount of potential degradation and/or the rate of change associated with the potential degradation locally at the vehicle 150 as well as upload or otherwise transmit the health monitoring data to the remote processing system 140 for analysis. For example, in some aspects, the remote processing system 140 may apply one or more machine learning models, artificial intelligence models, logic rules and/or other big data techniques to the health monitoring data (e.g., the identified component, amount of potential degradation, the rate of change of potential degradation and/or the thermal characterization curve) to determine what remedial actions should be initiated, how a maintenance schedule should be updated and/or the like and provide corresponding indicia of the remedial actions to be initiated to the control module 108 and/or an auxiliary system 120 to automatically initiate the remotely-determined remedial action(s) at the vehicle 150. Moreover, in some cloud-based implementations, the health monitoring process 400 may be implemented or otherwise performed at the remote processing system 140 in response to an uploaded thermal characterization curve or voltage measurement data received from the vehicle 150 after an iteration of the thermal characterization process 300.

It will be appreciated the health monitoring process 400 allows for the health of a DSC power conversion module to be monitored and diagnosed substantially in real-time during operation of an automotive vehicle whenever an electric motor driven by the DSC power conversion module does not need to be operated to provide traction. This allows for aging or potential degradation to be identified in a timely manner. Additionally, by mapping or tracing the potential degradation to a particular component within a thermal path of the DSC power conversion module, remedial actions may be automatically initiated in a manner that is commensurate with the particular component to which the potential degradation is attributed, as well as being commensurate with the amount and/or rate of change of potential degradation detected. Thus, potential aging or degradation of functional components or potential aging or degradation exhibiting potentially greater severity may automatically trigger more significant remedial actions (e.g., alerting the driver by illuminating the check engine light and recommending immediate repair and maintenance), while potential aging or degradation of non-functional components or potential aging or degradation exhibiting less severity may automatically trigger fewer and/or less significant remedial actions (e.g., logging the potential degradation and generating a maintenance code for future maintenance).

By providing onboard health monitoring and diagnostics for power conversion modules, and more particularly, power conversion modules with double-sided (or dual-sided) cooling (DSC) and dual thermal paths away from the power electronics, appropriate remedial action(s) commensurate with the nature of the potential degradation may be initiated in a manner that minimizes inconvenience and reduces the likelihood of unexpected inoperability. Identifying both the particular component of the DSC power conversion module exhibiting potential degradation in addition to the magnitude or amount of potential degradation allows for more aggressive remedial action(s) to be initiated when potential degradation is detected in association with the operational functionality of the power electronics relative to the remedial action(s) that may be initiated when potential degradation is detected in association with a component in a thermal path of the DSC power conversion module that is less operationally significant (e.g., a cooling jacket, a thermal interface layer, and/or the like). Such knowledge of the location and magnitude of potential degradation may also be utilized to inform or otherwise improve preventative maintenance scheduling. For example, the diagnostic data may be uploaded or otherwise transmitted to a remote processing system (e.g., a cloud computing node of a cloud computing environment) that may utilize artificial intelligence (AI), machine learning and/or other rule-based logic to analyze diagnostic data and dynamically adjust or otherwise adapt maintenance schedules to account for exhibited degradation substantially in real-time.

While at least one exemplary aspect has been presented in the foregoing detailed description, it should be appreciated that a vast number of variations exist. It should also be appreciated that the exemplary aspect or exemplary aspects are only examples, and are not intended to limit the scope, applicability, or configuration of the disclosure in any way. Rather, the foregoing detailed description will provide those skilled in the art with a convenient road map for implementing the exemplary aspect or exemplary aspects. It should be understood that various changes can be made in the function and arrangement of elements without departing from the scope of the disclosure as set forth in the appended claims and the legal equivalents thereof.

What is claimed is:

1. A vehicle system comprising:
a power conversion module comprising electrical components configured to provide a power converter contained within a housing, wherein the power conversion module comprises at least one thermal path between the electrical components and the housing;
one or more sensors to obtain measurement data for an electrical characteristic associated with the power converter;
a data storage element comprising computer readable instructions; and
a processing device for executing the computer readable instructions, the computer readable instructions controlling the processing device to perform operations comprising:
operating the power converter to conduct a heating current until reaching a steady-state temperature;
obtaining the measurement data after reaching the steady-state temperature;
determining a current thermal characterization curve for the power conversion module based on the measurement data;
comparing the current thermal characterization curve to one or more reference thermal characterization curves for the power conversion module to identify a deviation associated with the current thermal characterization curve; and
in response to identifying the deviation:
identifying a component associated with the deviation within the at least one thermal path of the power conversion module based on a location of a divergence point with respect to the current thermal characterization curve; and
automatically initiating a remedial action based on the component of the power conversion module associated with the deviation.

2. The vehicle system of claim 1, wherein the computer readable instructions control the processing device to perform the operations further comprising determining an amount of the deviation with respect to the one or more reference thermal characterization curves, wherein the remedial action is influenced by the component of the power conversion module associated with the deviation and the amount of the deviation.

3. The vehicle system of claim 1, wherein the computer readable instructions control the processing device to perform the operations further comprising determining a rate of change associated with the deviation, wherein the remedial action is influenced by the component of the power conversion module associated with the deviation and the rate of change associated with the deviation.

4. The vehicle system of claim 1, wherein automatically initiating the remedial action comprises the processing device automatically initiating generation of a maintenance code associated with the component of the power conversion module.

5. The vehicle system of claim 1, wherein automatically initiating the remedial action comprises the processing device automatically initiating generation of a user notification.

6. The vehicle system of claim 1, wherein automatically initiating the remedial action comprises the processing device automatically updating a maintenance schedule for a vehicle including the power conversion module.

7. The vehicle system of claim 1, wherein the housing comprises a plurality of openings for a liquid coolant.

8. The vehicle system of claim 7, wherein:
the housing encapsulates a power electronics substrate having the electrical components affixed thereto to provide double-sided cooling; and
the at least one thermal path comprises a plurality of thermal paths including a first thermal path between the power electronics substrate and the housing and a second thermal path between the electrical components and the housing.

9. The vehicle system of claim 1, wherein the one or more reference thermal characterization curves comprises an initial thermal characterization curve previously obtained for the power conversion module.

10. A method of monitoring health of a power conversion module, the method comprising:
   operating, by a control module, the power conversion module to conduct a heating current until reaching a steady-state temperature;
   after reaching the steady-state temperature, obtaining, by the control module, measurement data for an electrical characteristic associated with the power conversion module from one or more sensors associated with the power conversion module;
   determining, by the control module, a current thermal characterization curve for the power conversion module based on the measurement data;
   comparing, by the control module, the current thermal characterization curve to one or more reference thermal characterization curves for the power conversion module to identify a deviation associated with the current thermal characterization curve; and
   in response to identifying the deviation:
      identifying, by the control module, a component associated with the deviation within at least one thermal path of the power conversion module based on a location of a divergence point with respect to the current thermal characterization curve; and
      automatically initiating, by the control module, a remedial action based on the component of the power conversion module associated with the deviation.

11. The method of claim 10, further comprising:
   determining, by the control module, an amount of the deviation with respect to the one or more reference thermal characterization curves; and
   determining, by the control module, the remedial action based at least in part on the component of the power conversion module associated with the deviation and the amount of the deviation.

12. The method of claim 10, further comprising:
   determining, by the control module, a rate of change associated with the deviation; and
   determining, by the control module, the remedial action based at least in part on the component of the power conversion module associated with the deviation and the rate of change associated with the deviation.

13. The method of claim 10, wherein automatically initiating the remedial action comprises the control module automatically initiating generation of a maintenance code associated with the component of the power conversion module.

14. The method of claim 10, wherein automatically initiating the remedial action comprises the control module automatically initiating generation of a user notification.

15. The method of claim 10, wherein automatically initiating the remedial action comprises the control module automatically updating a maintenance schedule for a vehicle including the power conversion module.

16. The method of claim 10, wherein the power conversion module comprises a double-sided cooled (DSC) power conversion module including electrical components configured to provide a power converter contained within a housing configured to provide a plurality of thermal paths between the electrical components and the housing, wherein the housing comprises a plurality of openings for a liquid coolant.

17. The method of claim 16, wherein:
   the housing encapsulates a power electronics substrate having the electrical components affixed thereto to provide double-sided cooling; and
   the component associated with the deviation comprises at least one of:
      an attachment layer of material between the electrical components and the power electronics substrate; and
      a thermal interface material layer between the power electronics substrate and the housing.

18. A vehicle comprising:
   an electric motor;
   a power conversion module coupled to the electric motor, wherein the power conversion module comprises electrical components configured to provide a power inverter contained within a housing configured to provide double-sided cooling (DSC) comprising a plurality of thermal paths between the electrical components and the housing;
   one or more sensors to obtain measurement data for an electrical characteristic associated with the power inverter; and
   a control module coupled to the power conversion module and the one or more sensors, wherein the control module is configured to:
      operate the power inverter to conduct a heating current until reaching a steady-state temperature without producing torque at the electric motor;
      obtain the measurement data after reaching the steady-state temperature;
      determine a current thermal characterization curve for the power conversion module based on the measurement data;
      compare the current thermal characterization curve to one or more reference thermal characterization curves for the power conversion module to identify a deviation associated with the current thermal characterization curve; and
      in response to identifying the deviation:
         identify a component associated with the deviation within one of the plurality of thermal paths of the power conversion module based on a location of a divergence point with respect to the current thermal characterization curve; and
         automatically initiate a remedial action based on the component of the power conversion module associated with the deviation.

19. The vehicle of claim 18, further comprising an auxiliary system coupled to the control module, wherein the control module automatically initiates the remedial action by providing an indication of the remedial action to be initiated by the auxiliary system to the auxiliary system.

20. The vehicle of claim 19, wherein the remedial action comprises at least one of generation of a maintenance code and illumination of a dashboard indicator.

* * * * *